United States Patent
Akamatsu et al.

(10) Patent No.: US 8,673,762 B2
(45) Date of Patent: Mar. 18, 2014

(54) SOLDER, SOLDERING METHOD, AND SEMICONDUCTOR DEVICE

(75) Inventors: Toshiya Akamatsu, Kawasaki (JP); Nobuhiro Imaizumi, Kawasaki (JP); Seiki Sakuyama, Kawasaki (JP); Keisuke Uenishi, Suita (JP); Tetsuhiro Nakanishi, Toyonaka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/313,349

(22) Filed: Dec. 7, 2011

(65) Prior Publication Data

US 2012/0193800 A1    Aug. 2, 2012

(30) Foreign Application Priority Data

Jan. 31, 2011 (JP) ................. 2011-018233

(51) Int. Cl.
*H01L 21/44* (2006.01)
(52) U.S. Cl.
USPC ............. 438/615; 257/772; 257/E23.023; 257/E21.174; 420/559; 428/646
(58) Field of Classification Search
USPC .............. 420/560, 559; 257/772, E21.174; 257/E23.023; 438/615; 428/646; 228/180.22
See application file for complete search history.

(56) References Cited

U.S. PATENT DOCUMENTS

| | | | |
|---|---|---|---|
| 5,851,482 A * | 12/1998 | Kim ................. | 420/557 |
| 6,267,823 B1 * | 7/2001 | Yamaguchi et al. ............ | 148/24 |
| 2004/0155358 A1 * | 8/2004 | Iijima ........................ | 257/778 |
| 2005/0031483 A1 | 2/2005 | Liu et al. | |
| 2007/0152026 A1 * | 7/2007 | Suh et al. ................. | 228/193 |
| 2008/0182124 A1 * | 7/2008 | Gruber et al. ............... | 428/646 |
| 2009/0056977 A1 | 3/2009 | Shoji et al. | |
| 2009/0197114 A1 * | 8/2009 | Shih et al. ................... | 428/647 |
| 2010/0035072 A1 * | 2/2010 | Watanabe et al. ............. | 428/457 |

FOREIGN PATENT DOCUMENTS

| | | |
|---|---|---|
| CN | 1775458 | 5/2006 |
| JP | 62-252693 | 11/1987 |
| JP | 2001-334386 A1 | 12/2001 |
| JP | 2010-167472 A1 | 8/2010 |
| KR | 10-0743240 | 7/2007 |
| TW | I222910 | 11/2004 |
| TW | I325293 | 5/2010 |

OTHER PUBLICATIONS

Abstract of JP 2010-167472 A (Akamatsu et al) Aug. 5, 2010, 3 pages.*
Abstract of CN 17-75458 A (Huang et al) May 24, 2006, 2 pages.*
Abstract of CN 10-1700605 A (Chen et al) May 5, 2010, 2 pages.*
Korean Office Action mailed Apr. 11, 2013, with English translation, in counterpart Korean Application No. 10-2012-0000146.
Chinese Office Action issued for Chinese Patent Application No. 201110460651.5 dated Nov. 18, 2013.
Taiwan Office Action issued for Taiwan Patent Application No. 100145581 dated Dec. 16, 2013.

* cited by examiner

*Primary Examiner* — Caridad Everhart
(74) *Attorney, Agent, or Firm* — Kratz, Quintos & Hanson, LLP

(57) ABSTRACT

A solder includes Sn (tin), Bi (bismuth) and Zn (zinc), wherein the solder has a Zn content of 0.01% by weight to 0.1% by weight.

4 Claims, 8 Drawing Sheets

Sn-58wt%Bi-0.5wt%Sb

Sn-58wt%Bi-0.5wt%Sb-0.1wt%Zn

| COMPONENT | CONTENT (wt%) |
|---|---|
| Bi | 57.0 – 59.0 |
| Sn | BALANCE |
| Sb | 0.05 OR LESS |
| Cu | 0.03 OR LESS |
| Zn | 0.001 OR LESS |
| Fe | 0.02 OR LESS |
| Al | 0.001 OR LESS |
| As | 0.03 OR LESS |
| Cd | LESS THAN 0.002 |
| Pb | LESS THAN 0.05 |
| Ag | 0.02 OR LESS |
| In | 0.01 OR LESS |
| Ni | 0.005 OR LESS |
| Au | 0.005 OR LESS |

SOLDER, SOLDERING METHOD, AND SEMICONDUCTOR DEVICE

CROSS-REFERENCE TO RELATED APPLICATION

This application is based upon and claims the benefit of priority from the prior Japanese Patent Application No. 2011-018233 filed on Jan. 31, 2011, the entire contents of which are incorporated herein by reference.

FIELD

The embodiment discussed herein is related to a solder, a soldering method, and a semiconductor device.

BACKGROUND

Hitherto, for example, a Sn (tin)—Pb (lead) eutectic solder with a Pb (lead) content of, for example, 37% by weight has been widely used when electronic components are mounted on circuit boards. In recent years, however, the use of Pb-containing solder has been restricted from the viewpoint of achieving environmental protection, so that a Pb-free solder have been used.

A Sn—Ag—Cu alloy containing 3% by weight Ag (silver), 0.5% by weight Cu (copper), and the balance being Sn, is known as a typical Pb-free solder. Hereinafter, in the case of representing the composition of an alloy, the contents (wt %) are described before the symbols of elements. For example, the foregoing Sn—Ag—Cu alloy is represented by Sn-3 wt % Ag-0.5 wt % Cu.

In addition, a Sn-3.5 wt % Ag alloy and Sn-0.7 wt % Cu alloy are known as Pb-free solder alloys.

The following are reference documents.
[Document 1] Japanese Laid-open Patent Publication No. 62-252693
[Document 2] Japanese Laid-open Patent Publication No. 2001-334386
[Document 3] Japanese Laid-open Patent Publication No. 2010-167472

SUMMARY

According to an aspect of the embodiment, a solder includes Sn (tin), Bi (bismuth) and Zn (zinc), wherein the solder has a Zn content of 0.01% by weight to 0.1% by weight.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
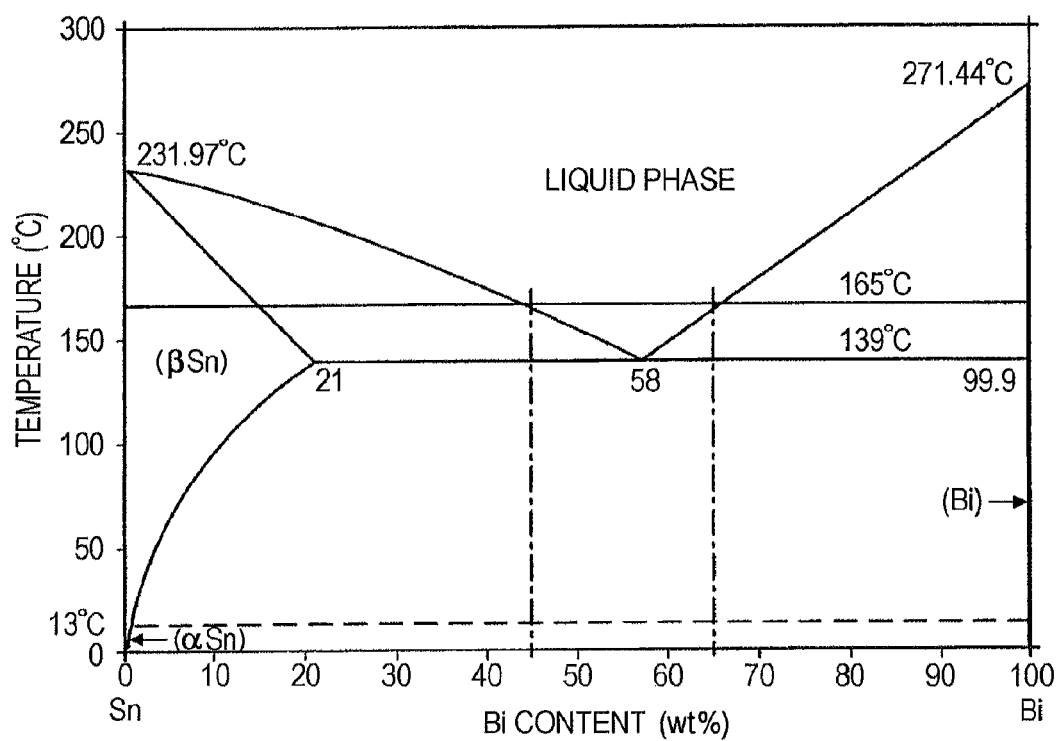
FIG. 1 is a phase diagram of a Sn—Bi alloy.

Before describing embodiments, preliminary information to facilitate understanding of embodiments will be described below.

For a flip chip ball grid allay (FC-BGA) package semiconductor device, a semiconductor chip (die) is mounted on the upper side of a package substrate (interposer) with a solder (solder bumps) for primary mounting. A solder (solder balls) for secondary mounting to establish a connection with a circuit board is arranged on the lower side of the package substrate. For the FC-BGA package semiconductor device, the solder for primary mounting should not melt during mounting on the circuit board. To this end, it is important that the melting point of the solder for secondary mounting be sufficiently lower than that of the solder for primary mounting.

All the Pb-free solder alloys described above have higher melting points than a Sn—Pb solder (eutectic solder). There is no low-melting-point Pb-free solder suitable as the solder for secondary mounting in the present circumstances. For example, a Sn-37 wt % Pb solder has a melting point of 183° C., whereas the Sn-3 wt % Ag-0.5 wt % Cu alloy has a melting point of 217° C., the Sn-3.5 wt % Ag alloy has a melting point of 221° C., and the Sn-0.7 wt % Cu alloy has a melting point of 227° C.

A Sn—Bi (bismuth) alloy is known as an alloy having a low melting point. For example, a Sn-58 wt % Bi alloy has a melting point of 139° C. It is thus contemplated that, for example, a Sn-3 wt % Ag-0.5 wt % Cu alloy may used as the solder for primary mounting and that a Sn-58 wt % Bi alloy may used as the solder for secondary mounting.

However, the Sn-58 wt % Bi alloy is hard and brittle. An impact or a great stress imposed on the alloy after joining will cause cracking. Thus, the alloy does not have sufficient reliability when it is used as a solder for electronic components.

Meanwhile, a Pb-free solder composed of a Sn—Bi alloy containing 0.5% by weight to 1.5% by weight Sb and 0.5% by weight to 3% by weight Ag and a Pb-free solder composed of a Sn—Bi alloy containing 0.3% by weight to 0.8% by weight Sb have been reported.

The inventors have conducted an environmental test (accelerated test) in which the Sn—Bi alloy (Pb-free solder) containing Ag or Sb is soldered to a Cu (copper) electrode and held in a high-temperature environment to check a reduction in the bonding strength. The results have demonstrated that in the case of the Pb-free solder, Cu reacts with Sn to grow an intermetallic compound (Cu—Sn reaction layer) and a brittle Bi-rich layer is formed at the interface between the electrode and the solder, thereby reducing the bonding strength.

In addition, a Sn—Bi alloy containing 0.1% by weight to 3% by weight Sb and 2% by weight to 4% by weight Zn (zinc) has been reported. However, this solder is suitable for ceramic materials and does not have sufficient wettability for an electrode material, such as Cu.

EMBODIMENTS

The inventors have conducted intensive studies on a Pb-free solder that may be used for FC-BGA package semiconductor devices, the Pb-free solder having a low-melting point and high ductility and maintaining sufficient bonding strength over an extended period of time. The results have demonstrated that a solder (Sn—Bi—Zn alloy) composed of a Sn—Bi alloy containing 0.01% by weight to 0.1% by weight Zn has a low melting point, forms the eutectic structure of Sn and Bi after solidification, and exhibits only a small reduction in strength even if an environmental test is performed in a high-temperature environment.

If the Sn—Bi—Zn alloy has a Bi content of less than 45% by weight, the precipitation of primary crystals of Sn is increased to increase the melting point of the alloy (solder). If the Sn—Bi—Zn alloy has a Bi content exceeding 65% by weight, the melting point and the precipitation of primary crystals of Bi are increased to make the alloy brittle. Thus, the Sn—Bi—Zn alloy preferably has a Bi content of 45% by weight to 65% by weight.

FIG. 1 is a phase diagram of a Sn—Bi alloy. As illustrated in FIG. 1, when the Bi content is in the range of 45% by weight to 65% by weight, the Sn—Bi alloy has a melting point of 165° C. or less. The Pb-free solder (Sn—Bi—Zn alloy) according to this embodiment is a Sn—Bi alloy into which Zn is incorporated. The melting point of the Pb-free solder is substantially the same as that of the melting point of the Sn—Bi alloy because Zn content is as low as 0.1% by weight or less.

Figure 2:
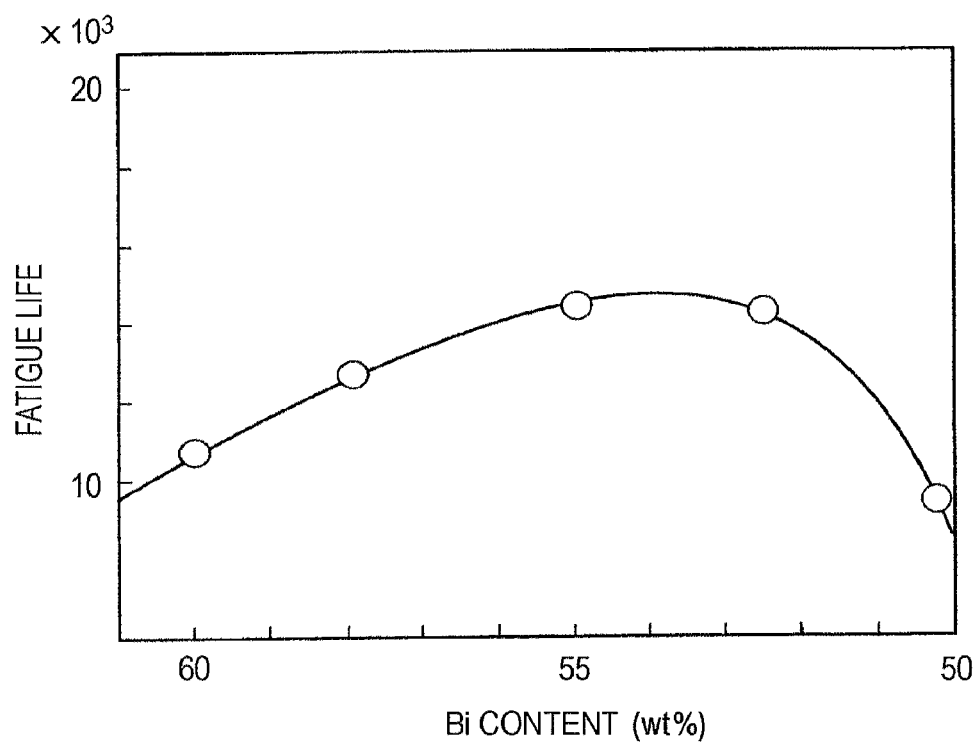
FIG. 2 is a graph illustrating the relationship between the Bi content and the fatigue life of a Sn—Bi alloy.
Figure 3:
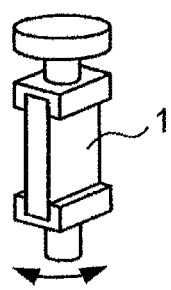
FIG. 3 is an explanatory drawing of the outline of a method for measuring fatigue life.

FIG. 2 is a graph illustrating the relationship between the Bi content and the fatigue life of a Sn—Bi alloy, the horizontal axis representing the Bi content, and the vertical axis representing the fatigue life. As illustrated in FIG. 3, a torsional strain of 0.5% is repeatedly applied to a test specimen 1 at a speed of 6.28 rad/sec, the test specimen 1 measuring 10 mm wide by 50 mm long by 0.7 mm thick. The number of cycles (the number of repetitions) when the test specimen 1 is damaged is measured and defined as fatigue life.

As is clear from FIG. 2, when the Bi content is in the range of 51% by weight to 60% by weight, the number of repetitions is $10 \times 10^3$ or more, which demonstrates a sufficiently long fatigue life. Considering the fatigue life as well as the melting point, the Sn—Bi—Zn alloy preferably has a Bi content of 51% by weight to 60% by weight.

Zn improves the bonding strength to the Cu electrode. That is, Zn reacts with Cu, which is an electrode material, to form a Cu—Zn compound at the interface between the electrode and the solder. The Cu—Zn compound improves the bonding strength between the electrode and the solder.

However, when the Sn—Bi—Zn alloy has a Zn content of less than 0.01% by weight, the amount of the Cu—Zn compound formed is small, thereby failing to sufficiently improve the bonding strength. When the Sn—Bi—Zn alloy has a Zn content exceeding 0.1% by weight, the wettability of the solder is reduced. The reduction in the wettability of the solder requires highly active flux. Typically, highly active flux is highly corrosive. Even a small amount of flux residues after flux cleaning reduces long-term reliability. So, the Zn content of the Pb-free solder (Sn—Bi—Zn alloy) according to this embodiment is set in the range of 0.01% by weight to 0.1% by weight.

As described above, the incorporation of Zn into the Sn—Bi alloy improves the bonding strength at the interface between the electrode and the solder, thereby suppressing the rupture of a joint. However, if the solder itself has low strength, a solder portion is ruptured at the time of the application of stress. Thus, the strength of the solder itself is preferably increased.

Figure 4:
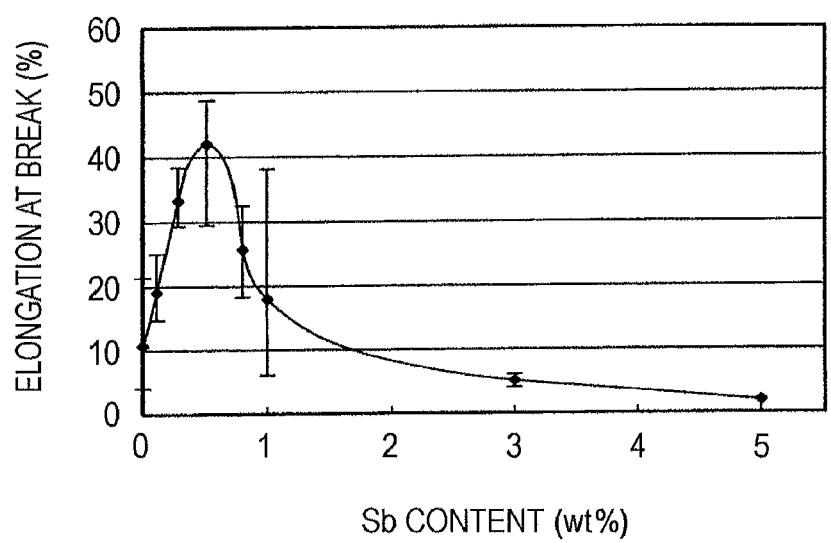
FIG. 4 is a graph illustrating the relationship between the Sb content and the elongation at break of a Sn—Bi—Sb alloy.

FIG. 4 is a graph illustrating the relationship between the Sb content and the elongation at break of a Sn—Bi—Sb alloy, the horizontal axis representing the Sb content, and the vertical axis representing the elongation at break. As is clear from FIG. 4, at a Sb content of the Sn—Bi—Sb alloy of 0.5% by weight, a higher Sb content results in a higher elongation at break. At a Sb content exceeding 0.5% by weight, a higher Sb content results in a lower elongation at break. FIG. 4 also demonstrates that the elongation at break at a Sb content of 0.3% by weight to 0.8% by weight is surely larger than that of a Sn-58 wt % Bi alloy (at an Sb content of 0 in FIG. 4).

Thus, in the Pb-free solder according to this embodiment, Sb is preferably contained in the range of 0.3% by weight to 0.8% by weight. This improves ductility and suppresses the rupture of the solder portion as well as the rupture of the joint between the electrode and the solder.

Figure 5A:
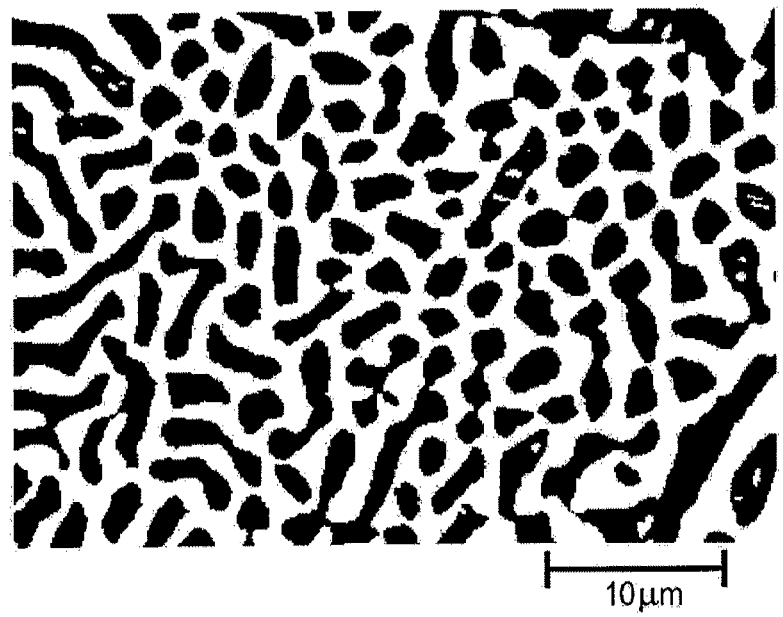
FIG. 5A is a binarized scanning electron micrograph of the structure of a Sn-58 wt % Bi-0.5 wt % Sb alloy.
Figure 5B:
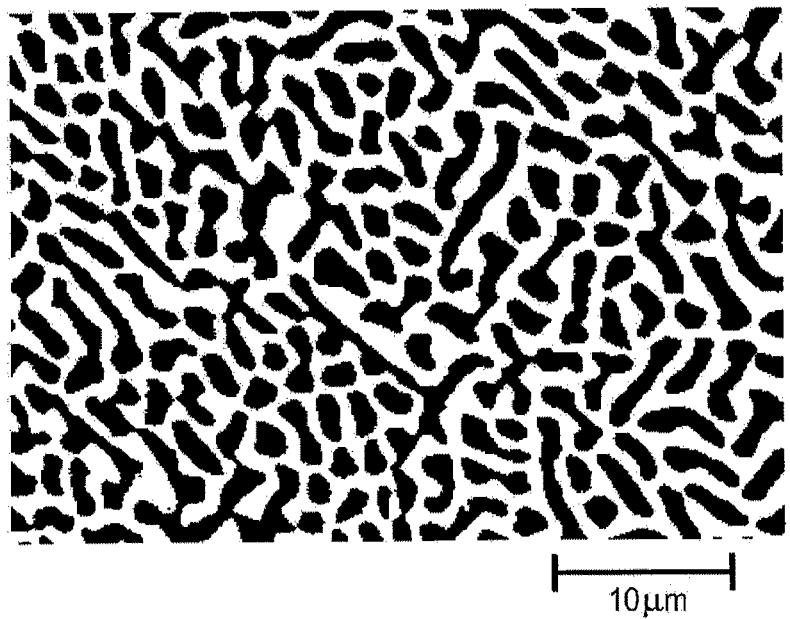
FIG. 5B is a binarized scanning electron micrograph of the structure of a Sn-58 wt % Bi-0.5 wt % Sb-0.1 wt % Zn alloy.

FIG. 5A is a binarized scanning electron micrograph of the structure of a Sn-58 wt % Bi-0.5 wt % Sb alloy. FIG. 5B is a binarized scanning electron micrograph of the structure of a Sn-58 wt % Bi-0.5 wt % Sb-0.1 wt % Zn alloy.

In FIGS. 5A and 5B, dark-shaded portions represent Sn, and light-shaded portions represent Bi. Sb is one of few elements that form complete solid solutions with Bi. Sb incorporated into a Sn—Bi alloy is bonded to Sn to form an intermetallic compound. In the case of the Sn—Bi alloy, Bi crystallizes out as eutectic crystals or crystallizes from Sn. The incorporation of Sb into the Sn—Bi alloy results in a reduction in the size of the eutectic structure to improve the ductility (elongation).

As is clear from FIGS. 5A and 5B, even if Zn is incorporated into the Sn—Bi—Sb alloy, little coarsening of the eutectic structure or little crystallization of Zn occurs, so that a fine structure is obtained.

The properties of the Pb-free solder according to this embodiment will be described below.

Bump Pull Testing at Normal Temperature

Figures 6, 7:
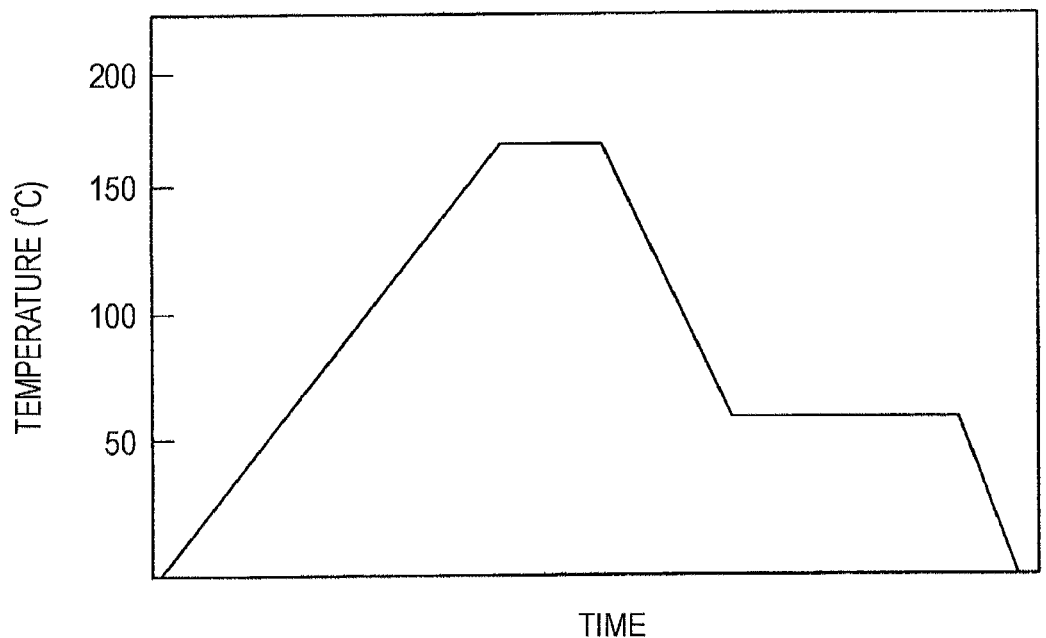
FIG. 6 is a list of components of a Sn-58 wt % Bi alloy.
FIG. 7 is a graph illustrating an exemplary temperature profile at the time of reflow.

A Sn-58 wt % Bi alloy was prepared as sample 1. FIG. 6 is a list of components of the Sn-58 wt % Bi alloy. In FIG. 6, elements except Sn and Bi are impurities (incidental impurities).

Next, Sb was added to a Sn—Bi alloy, having the same composition as sample 1, in a proportion of 0.5% by weight to form a Sn—Bi—Sb alloy, which was defined as sample 2. Zn was added to Sn—Bi—Sb alloys, having the same composition as sample 2, in proportions of 0.01% by weight, 0.5% by weight, 1.0% by weight, and 1.5% by weight to form Sn—Bi—Sb—Zn alloys, which were defined as samples 3 to 6.

A plurality of printed circuit boards (glass epoxy boards) each measuring 110 mm by 110 mm by 1.0 mm thick were prepared. Cu electrodes (lands) each having a diameter of 0.64 mm were arranged in a matrix on a surface of each of the printed circuit board. A solder mask was provided on the surface of each printed circuit board. Openings each having a diameter of 0.54 mm were arranged in portions of the solder mask corresponding to the Cu electrodes.

Spherical solder balls and solder pastes were prepared from the alloys of samples 1 to 6. The solder pastes were applied by printing to the Cu electrodes (lands) of the printed circuit boards. Then the solder balls were mounted on the solder pastes. Note that different solder pastes and different solder balls were used for each printed circuit board. The solder pastes and the solder balls provided on the same printed circuit boards were composed of the same samples (alloys).

Next, reflowing was performed in a nitrogen atmosphere to bond the solder balls to the Cu electrodes. During the reflowing, the temperature was raised to 180° C., reduced to a temperature equal to or lower than the melting point, maintained at the temperature for a predetermined period of time, and reduced to room temperature, as illustrated in the temperature profile depicted in FIG. 7.

The resulting printed circuit boards in which the solder balls were bonded to the Cu electrodes were used as test specimens. The test specimens were placed in an electric furnace, maintained at 125° C., removed from the electric furnace after a lapse of a predetermined time, and subjected to bump pull testing at normal temperature. The bump pull testing at normal temperature was performed with a tester (Model: SRRIS-4000P, manufactured by DAGE Corp).

Figure 8:
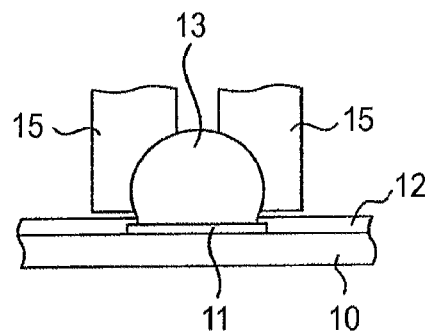
FIG. 8 is an explanatory drawing of the outline of bump pull testing.

FIG. 8 is an explanatory drawing of the outline of the bump pull testing. In FIG. 8, reference numeral 15 denotes jaws of the tester, reference numeral 10 denotes a printed circuit board, reference numeral 11 denotes a Cu electrode, reference numeral 12 denotes a solder mask, and reference numeral 13 denotes a solder ball. As illustrated in FIG. 8, the solder ball 13 was gripped by the jaws 15 and peeled off at a speed of 300 μm/s, thereby measuring stress at break (tensile strength).

Figure 9:
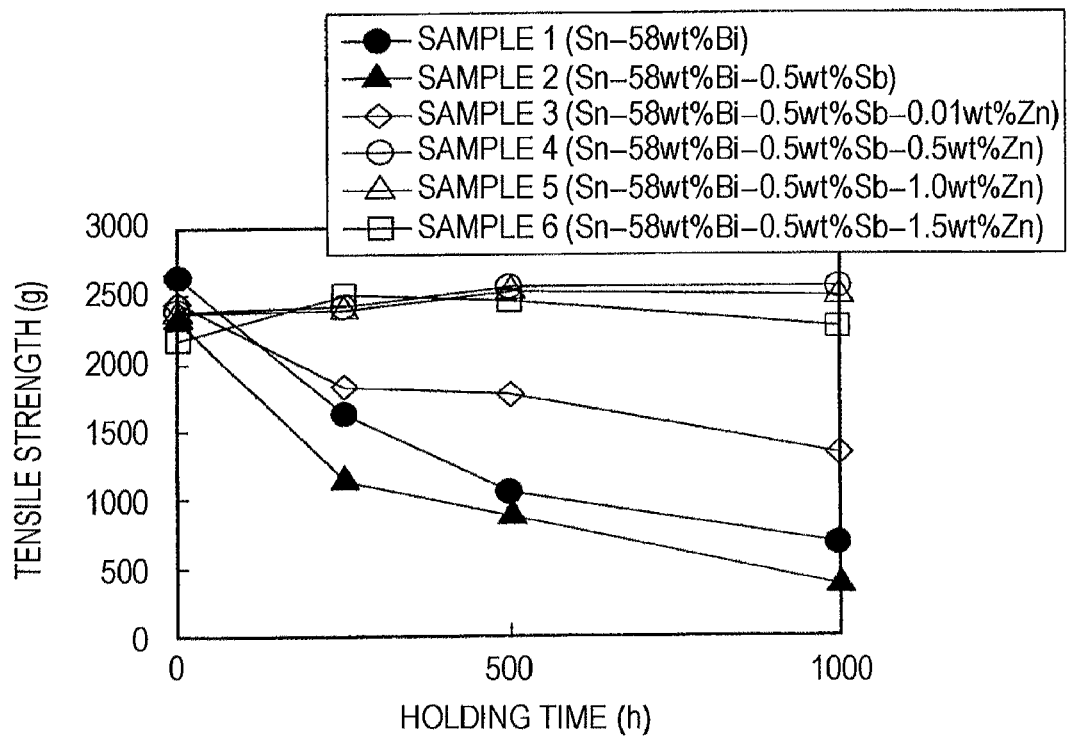
FIG. 9 is a graph illustrating the results of the bump pull testing.
Figure 10:
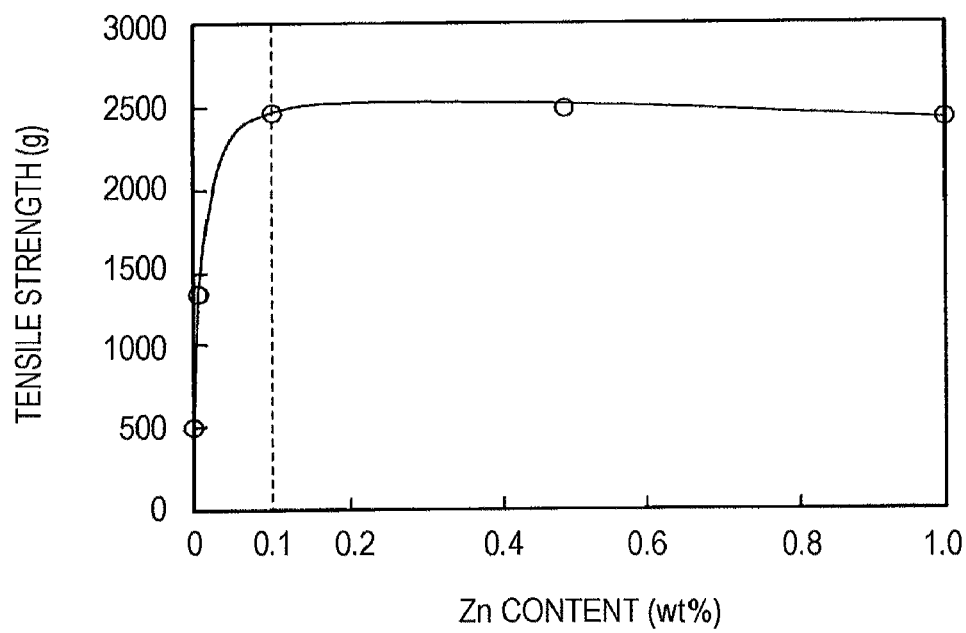
FIG. 10 is a graph illustrating the relationship between the Zn content and the tensile strength (breaking stress) of a Sn-58 wt % Bi-0.5 wt % Sb—Zn alloy after holding at 125° C. for 1000 hours.

FIG. 9 is a graph illustrating the results of the bump pull testing, the horizontal axis representing the time, and the vertical axis representing the tensile strength. FIG. 10 is a graph illustrating the relationship between the Zn content and the tensile strength (breaking stress) of a Sn-58 wt % Bi-0.5 wt % Sb—Zn alloy after holding at 125° C. for 1000 hours, the horizontal axis representing the Zn content, and the vertical axis representing the tensile strength.

As is clear from FIG. 9, in each of sample 1 (Sn-58 wt % Bi) and sample 2 (Sn-58 wt % Bi-0.5 wt % Sb), which did not contain Zn, the tensile strength after holding at 125° C. for 1000 hours was reduced to ⅓ or less of the initial tensile strength. In contrast, in each of samples 3 to 6, which contained 0.01% by weight or more Zn, the tensile strength after holding at 125° C. for 1000 hours was slightly reduced.

The reason the incorporation of Zn improves the strength is considered as follows: For each of the Sn—Bi alloys that do not contain Zn, Sn is bonded to Cu at the interface between the Cu electrode and the solder (Sn—Bi alloy) to cause a deficiency of Sn, thereby forming a brittle Bi-rich layer. In contrast, for each of the Sn—Bi—Zn alloys, Zn is preferentially bonded to Cu, so that the deficiency of Sn does not occur, thus suppressing the formation of the brittle Bi-rich layer. This makes it possible to maintain sufficient strength over prolonged periods of time.

The test results described above demonstrate that the Sn—Bi—Zn alloy preferably contains 0.01% by weight or more Zn.

Wettability Test

As with the bump pull testing at normal temperature, Sn-58 wt % Bi alloy was prepared as sample 1. Next, Sb was added to a Sn—Bi alloy, having the same composition as sample 1, in a proportion of 0.5% by weight to form a Sn—Bi—Sb alloy, which was defined as sample 2. Zn was added to Sn—Bi—Sb alloys, having the same composition as sample 2, in proportions of 0.01% by weight, 0.1% by weight, 0.2% by weight, 0.5% by weight, and 1.0% by weight to form Sn—Bi—Sb—Zn alloys, which were defined as samples 3 to 7.

A rosin flux (RMA type) was applied to a Cu plate having a purity of 99.9%. Then 0.76-mm-diameter solder balls composed of the alloys of samples 1 to 7 were mounted on the Cu plate. Next, reflowing was performed in a nitrogen atmosphere. During the reflowing, the temperature was raised to 180° C., reduced to a temperature equal to or lower than the melting point, maintained at the temperature for a predetermined period of time, and reduced to room temperature, as illustrated in the temperature profile depicted in FIG. 7.

The height of the solder after the reflowing was measured with a height gauge including an optical microscope. Then the degree of spreading by wetting was calculated.

Figure 11:
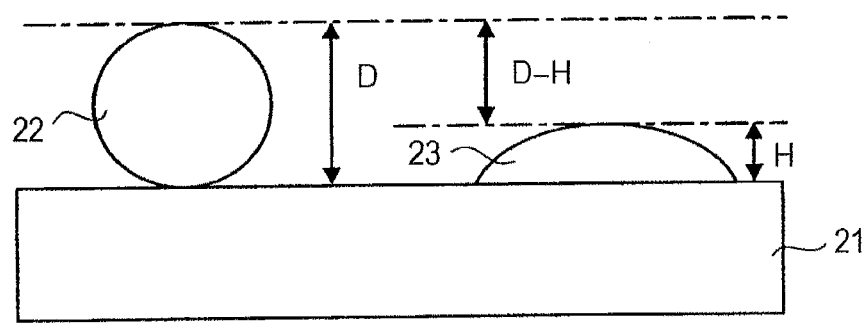
FIG. 11 is an explanatory drawing of a method for calculating the degree of spreading by wetting.

FIG. 11 is an explanatory drawing of a method for calculating the degree of spreading by wetting. In FIG. 11, reference numeral 21 denotes a Cu plate, reference numeral 22 denotes a solder ball before reflowing, and reference numeral 23 denotes solder after reflowing. As illustrated in FIG. 11, the degree of spreading by wetting is calculated using the following formula (I):

$$\text{Degree of spreading by wetting (\%)} = 100(D-H)/D \qquad (1)$$

Where D represents the diameter of the solder ball 22 before reflowing, and H represents the height of the solder 23 after reflowing.

Figure 12:
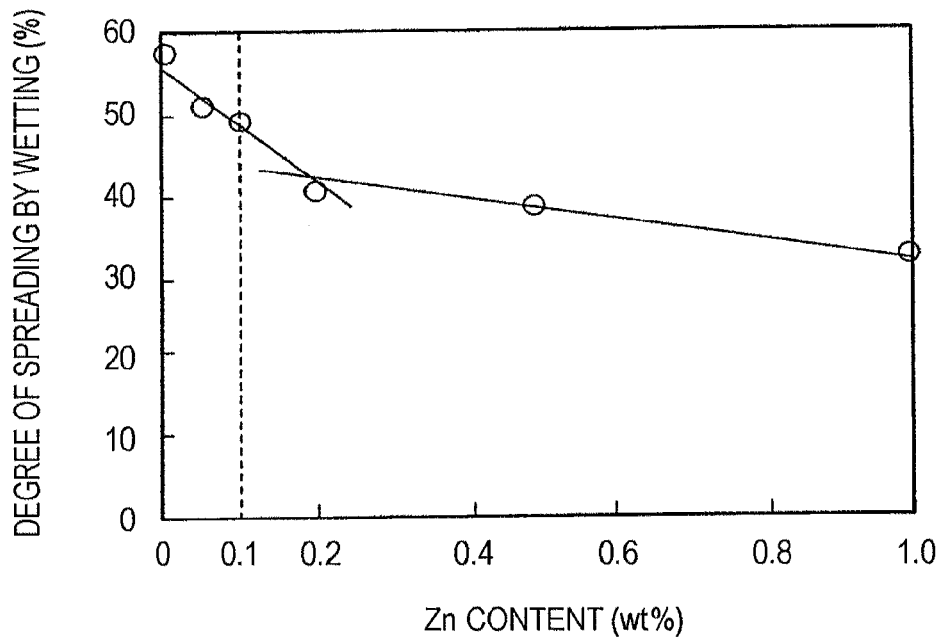
FIG. 12 is a graph illustrating the relationship between the Zn content of a Sn—Bi—Sb alloy and the degree of spreading by wetting.

FIG. 12 is a graph illustrating the relationship between the Zn content of the Sn—Bi—Sb alloy and the degree of spreading by wetting, the horizontal axis representing the Zn content, and the vertical axis representing the degree of spreading by wetting. As is clear from FIG. 12, a higher Zn content results in a lower degree of spreading by wetting. At a Zn content of 0.1% by weight, the degree of spreading by wetting is about 50%. At a Zn content of 0.2% by weight or more, the degree of spreading by wetting is about 40% or less.

When the degree of spreading by wetting is 40% or less, highly active flux is needed at the time of soldering. Furthermore, insufficient cleaning after soldering causes the corrosion of the solder, thus leading to a significant reduction in long-term reliability. In this embodiment, therefore, the Zn content of the Sn—Bi—Zn alloy is set to 0.1% by weight or less.

FC-BGA Package Semiconductor Device

Figure 13:
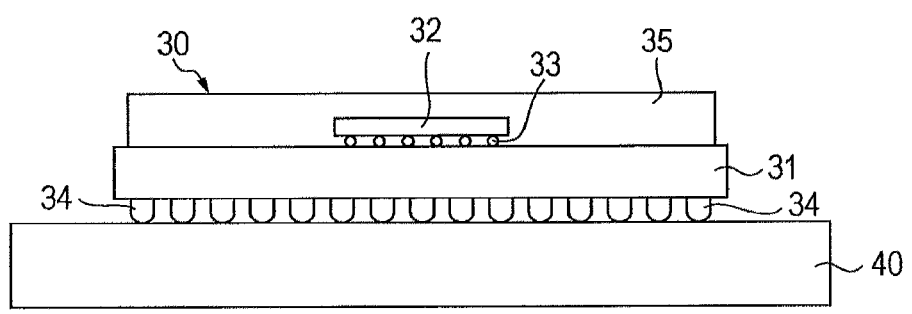
FIG. 13 is a cross-sectional view of an exemplary flip chip ball grid array (FC-BGA) package semiconductor device.

FIG. 13 is a cross-sectional view of an exemplary flip chip ball grid array (FC-BGA) package semiconductor device. As illustrated in FIG. 13, in an FC-BGA package semiconductor device 30, a semiconductor chip 32 is mounted on a package substrate 31 with a solder 33 for primary mounting (solder bumps). The semiconductor chip 32 is sealed with a sealing resin 35.

Pads (conductive patterns, not illustrated) composed of metal foil are arranged on an upper surface and a lower surface of the package substrate 31. The pads arranged on the upper surface and the pads arranged on the lower surface of the package substrate 31 are electrically connected to each other through interconnection lines (wiring pattern and vias, not illustrated) arranged in the package substrate 31.

The pads arranged on the lower surface of the package substrate 31 are bonded to a solder 34 (solder balls) for secondary mounting, the solder balls being used to mount the semiconductor chip 32 on a circuit board 40. An electronic circuit arranged in the semiconductor chip 32 is electrically connected to interconnection lines on the circuit board 40 through the solder 34 for secondary mounting.

Examples of an alloy that may be used as the solder 33 for primary mounting include a Sn-3.5 wt % Ag alloy having a melting point of 221° C., a Sn-0.7 wt % Cu alloy having a melting point of 227° C., and a Sn-3 wt % Ag-0.5 wt % Cu alloy having a melting point of 217° C. As the solder 34 for secondary mounting, the Sn—Bi—Zn alloy or Sn—Bi—Sb—Zn alloy according to this embodiment may be used. In this way, the use of Pb-free solder as the solder 33 for primary mounting and the solder 34 for secondary mounting prevents environmental pollution caused by Pb.

When the FC-BGA package semiconductor device 30 is mounted (soldered) on the circuit board 40, for example, heating and cooling are performed according to the temperature profile illustrated in FIG. 7.

Each of the Sn—Bi—Zn alloy (solder) and the Sn—Bi—Sb—Zn alloy (solder) according to this embodiment has a melting point of about 135° C. to about 150° C. Thus, the solder needs to be heated to a temperature higher than the melting point during soldering. However, an excessively high temperature adversely affects electronic components and so forth. So, the solder may be heated to, for example, 160° C. to 180° C. In this case, as indicated by a solid line in FIG. 7, the solder may be linearly heated from room temperature to a temperature at which the Sn—Bi—Zn alloy melts. Alternatively, the solder may be heated to a temperature lower than the melting temperature, maintained at the temperature for a predetermined period of time, and heated to the melting temperature.

After soldering, the temperature may be reduced by natural cooling. An excessively high cooling rate does not result in satisfactory eutectic structure. At an excessively low cooling rate, the process requires a long time, thus causing an increase in production cost. So, the cooling rate is preferably in the range of, for example, 0.05° C./sec to 5° C./sec.

In the temperature profile illustrated in FIG. 7, a cooling step includes a holding substep of holding the solder at a temperature which is lower than the melting point of the solder and which is higher than room temperature for a predetermined period of time (for example, 0.5 minutes or more). This holding substep is not essential. To further suppress the coarsening of the eutectic structure, the holding substep is preferably performed. The holding substep may be performed at, for example, 50° C. to 100° C.

For the resulting FC-BGA package semiconductor device 30 mounted on the circuit board 40, even if an impact or a stress is applied thereto, failure, such as cracking, does not occur in joints. That is, the joints have high reliability.

In the foregoing embodiment, the Pb-free solder according to the embodiment is used as the solder for secondary mounting in the FC-BGA package semiconductor device. Of course, the Pb-free solder according to the embodiment may not be used as the solder for secondary mounting but may be used to connect an electronic component to a circuit board in the usual manner. Furthermore, as described above, the solder material containing 45% by weight to 65% by weight Bi, 0.01% by weight to 0.1% by weight Zn, 0.3% by weight to 0.8% by weight Sb, and Sn improves the fatigue properties and bonding strength. Similarly, the joint composed of the solder containing 45% by weight to 65% by weight Bi, 0.01% by weight to 0.1% by weight Zn, 0.3% by weight to 0.8% by weight Sb, and Sn has high reliability. That is, no failure is detected after 1000 cycles or more in a temperature cycling test from −55° C. to 125° C.

The Pb-free solder according to the embodiment has a low melting point, thus reducing the energy consumed in the soldering process and reducing the production cost of the semiconductor device. Furthermore, a heat load imposed on an electronic component to be soldered is low, thus preventing the degradation of the electronic component by heat during soldering. For the reasons described above, the Pb-free solder according to this embodiment is suitably used for mounting miniaturized electronic components having high packing densities.

The semiconductor device may be used in electronic apparatuses, such as consumer apparatuses, e.g., personal computers and cellular phones, servers, routers, and networking products, thereby improving the reliability of electronic apparatuses.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A solder comprising:
Sn (tin);
45% by weight to 65% Bi (bismuth);
0.01% by weight to 0.1% by weight Zn (zinc), and
0.3% by weight to 0.8% by weight Sb (antimony).

2. A soldering method for soldering an electronic component to a substrate, comprising the steps of:
attaching a solder between the electronic component and a conductive pattern on the substrate, the solder being heated to a temperature equal to or higher than the melting point of the solder;
cooling the solder to a temperature that is lower than the melting point and that is higher than room temperature and holding the solder at the temperature for a predetermined period of time; and
cooling the solder to room temperature,
wherein the solder contains Sn (tin), 45% by weight to 65% by weight Bi (bismuth), and 0.01% by weight to 0.1% by weight Zn (zinc), and 0.3% by weight to 0.8% by weight Sb (antimony).

3. An electronic apparatus comprising:
a solder constituting a joint between an electronic component and a substrate,
wherein the solder contains 45% by weight to 65% by weight Bi (bismuth), 0.01% by weight to 0.1% by weight Zn (zinc), 0.3% by weight to 0.8% by weight Sb(antimony), and Sn (tin).

4. A semiconductor device comprising:
a semiconductor chip;
a package substrate including a conductive pattern arranged on each surface of the package substrate;
a first solder arranged between one surface of the package substrate and the semiconductor chip, the first solder connecting the semiconductor chip to the package substrate; and
a second solder connected to the conductive pattern arranged on the other surface of the package substrate,
wherein the melting point of the first solder is higher than that of the second solder, the second solder contains Sn (tin), 45% by weight to 65% by weight Bi (bismuth), 0.01% by weight to 0.1% by weight Zn (zinc), and 0.3% by weight to 0.8% by weight Sb(antimony).

\* \* \* \* \*